United States Patent [19]

Irick et al.

[11] 4,229,693
[45] Oct. 21, 1980

[54] METHOD AND APPARATUS FOR CAPACITANCE TESTING PRINTED CIRCUIT BOARDS

[75] Inventors: Dan F. Irick, Glendale; Roger F. Zollinger, Phoenix, both of Ariz.

[73] Assignee: Honeywell Information Systems Inc., Phoenix, Ariz.

[21] Appl. No.: 963,638

[22] Filed: Nov. 24, 1978

[51] Int. Cl.³ ............................................. G01R 15/12
[52] U.S. Cl. .............................. 324/73 PC; 324/158 F
[58] Field of Search ......... 269/21; 324/158 F, 73 PC, 324/51

[56] References Cited

U.S. PATENT DOCUMENTS

| | | | |
|---|---|---|---|
| 2,301,106 | 11/1942 | Brown | 324/158 F |
| 4,012,693 | 3/1977 | Sullivan | 324/73 PC |

OTHER PUBLICATIONS

H. Bohlen, Workpiece Holder, IBM Technical Disclosure Bulletin, vol. 20, No. 1, Jun. 1977 pp. 228, 229.
B. Ventimiglia, Vacuum Chuck, IBM Technical Disclosure Bulletin, vol. 10, No. 11, Apr. 1968, p. 1759.

*Primary Examiner*—Michael J. Tokar
*Attorney, Agent, or Firm*—T. W. DeMond; W. W. Holloway, Jr.

[57] ABSTRACT

This relates to a method and apparatus for testing printed circuit boards. The printed circuit board to be tested is placed on a metal plate and covered with a thin plastic film. The plastic film is coupled to the metal plate to form a substantially air-tight chamber occupied by the printed circuit board. A vacuum is then created in the chamber to secure the printed circuit board. A capacitance meter has a first terminal coupled to the metal plate and a second terminal coupled to a probe which is used to puncture the plastic film to make contact with electrical interconnects on the board.

9 Claims, 2 Drawing Figures

METHOD AND APPARATUS FOR CAPACITANCE TESTING PRINTED CIRCUIT BOARDS

BACKGROUND OF THE INVENTION

This invention relates generally to the testing of printed circuit boards and, more particularly, to a method and apparatus for capacitance testing printed circuit boards.

Testing of printed circuit boards in the manufacturing environment has been typically performed by means of circuit analyzers which make resistance measurements of the circuits on printed circuit boards. Normally, the printed circuit board is coupled to the circuit analyzer by means of a multiprobe fixture which makes contact to all of the circuit interconnect points simultaneously.

While this time-proven method yields satisfactory results, the initial tooling cost for such an analyzer and test fixture is high and may not be justifiable for a small quantity of printed circuit boards.

SUMMARY OF THE INVENTION

It is an object of the present invention to provide an economical method and apparatus for testing non-standard, non-fixtured printed circuit boards to detect open circuit and short circuit networks on the board.

It is a further object of the present invention that the inventive test apparatus be capable of testing any printed circuit board and not be limited by the size of the board or the circuit connect point pattern on the board.

It is still a further object of the invention that the inventive printed circuit board tester have an unlimited test point capability.

Finally, it is an object of the invention to provide a method and apparatus for testing printed circuit boards using single probe capacitance testing techniques.

According to a broad aspect of the invention there is provided an apparatus for testing printed circuit boards having electrical interconnects thereon, comprising: a metal base for supporting the printed circuit board to be tested; a plastic film disposed over said printed circuit board and coupled to said metal base; first means for creating a vacuum in the region between said plastic film and said metal base for securely positioning said printed circuit board; and second means for measuring the capacitance between said metal base and the electrical interconnects on said printed circuit board.

According to a further aspect of the invention there is provided a method for testing printed circuit boards having electrical interconnects thereon comprising: placing said printed circuit board on a metal base; covering said printed circuit board with a plastic film and coupling said plastic film to said metal base; creating a vacuum between said metal base and said plastic film whereby said printed circuit board is secured on said metal base by said plastic film; coupling one terminal of a capacitance meter to said metal base and a second terminal to a probe; and piercing said plastic film with said probe to make contact with said electrical interconnects.

The above and other objects of the present invention will be more clearly understood from the following detailed description taken in conjunction with the accompanying drawings in which:

DESCRIPTION OF THE PREFERRED EMBODIMENT

Figure 1:
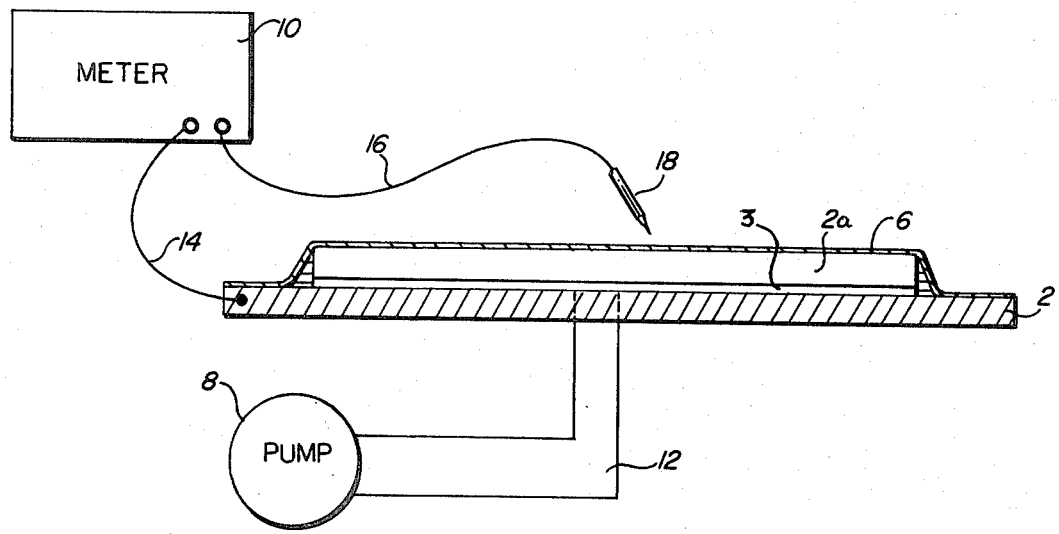
FIG. 1 is a functional diagram illustrating the inventive test apparatus and method.

FIG. 1 is a functional diagram of apparatus which performs printed circuit board testing according to the present invention. A metal plate 2, for example aluminum or steel, has disposed thereon an insulator (e.g. vellum) 3 which has supported thereon a printed circuit board 4 to be tested. Covering the printed circuit board is a thin plastic film 6 (e.g. polyethylene) which is coupled to the metal base plate 2 near its periphery. The combination of the metal plate 2 and plastic film 6 forms a vacuum chamber 2a which is coupled to vacuum pump 8 via conduit 12. The conduit 12 is coupled to at least one hole in metal plate 2. By creating a vacuum in the region occupied by printed circuit board 4, the printed circuit board is securely positioned on the metal base plate 2. Clearly, the printed circuit board could be otherwise coupled to the metal base plate by means of, for example, metal clamps or weights. However, the use of such devices would result in obstructions of the working surface on the printed circuit board. The techniques shown in FIG. 1 permits a free working surface which may be operated upon by automatic testing (probing) apparatus.

A capacitance meter 10 has a first terminal coupled to the metal base plate via line 14. The second terminal of capacitance meter 10 is coupled to probe 18. Capacitance readings for detecting open and short circuits on a printed circuit board are made by forcing the test probe through the plastic film into electrical contact with points on the electrical circuit. The plastic film may be punctured and the printed circuit board probed numerous times without destroying the vacuum between the plastic film and the metal base plate 2.

Figure 2:
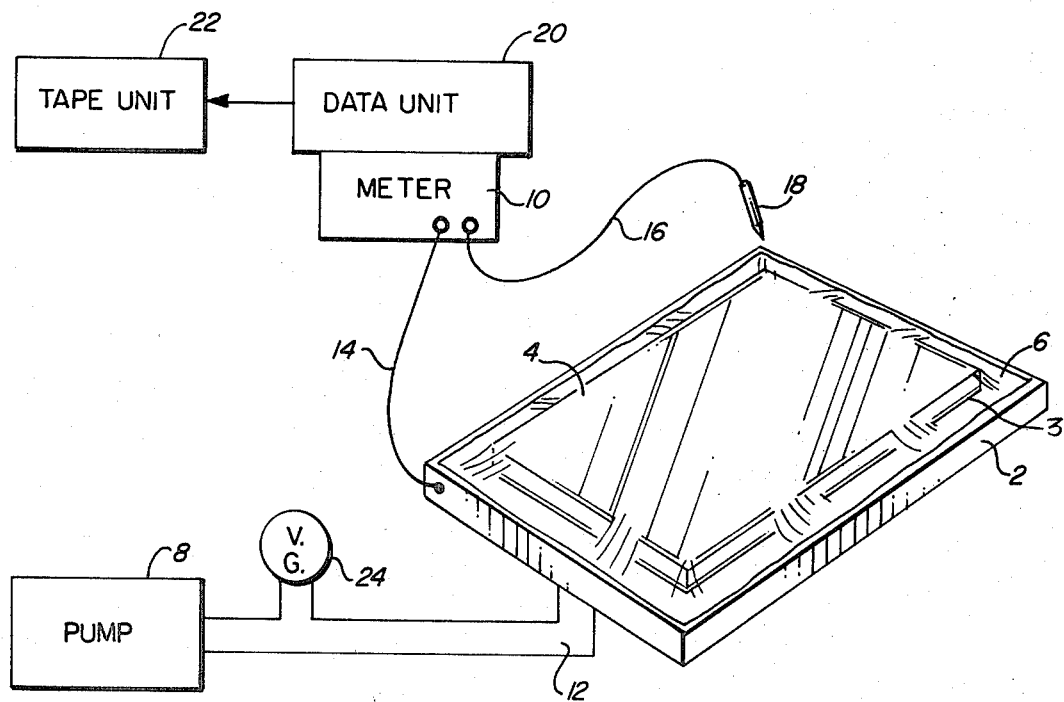
FIG. 2 illustrates a more elaborate system employing the inventive method.

FIG. 2 illustrates a more elaborate arrangement for carrying out the inventive technique. As in FIG. 1, a metal base plate 2 supports the printed circuit board 4. A vacuum pump 8 is coupled through an aperture in metal base plate 2. The vacuum chamber thus formed comprises the area between metal base plate 2 and a thin plastic film 6 which is disposed over printed circuit board 4.

The vacuum created around the printed circuit board is monitored by a vacuum guage 24. A capacitance meter 10, for example an HP 4271A LCR meter has a first terminal 14 coupled to the metal base plate 2 and a second terminal 16 coupled to a probe 18. The output of the capacitance meter 10 is coupled into a data capture and formatting unit 20 which merely stores the output of meter 10 and converts it into a suitable form to be recorded by a tape cassette unit 22. Unit 22 may also have a paper readout. Thus, unit 22 provides a rapid method for making and recording test data.

As in the case of FIG. 1, probe 18 is used to puncture the thin plastic film 6 to make contact with electrical interconnects on the printed circuit board. The plastic film may be punctured many times without causing a substantial degradation of the vacuum chamber. Thus, even after many probes, the printed circuit board 4 is firmly positioned on metal plate 2.

While in accordance with the provisions and statutes there has been illustrated and described the best form of invention known, certain changes may be made to the system described without departing from the spirit of the invention as set forth in the appended claims.

We claim:

1. An apparatus for testing printed circuit boards having electrical interconnects therein, comprising:
    a metal base for supporting the printed circuit board to be tested;
    a plastic film disposed over said printed circuit board and coupled to said metal base;
    first means coupled to said metal base via said aperture for creating a vacuum in the region between said plastic film and said metal base for securely positioning said printed circuit board; and
    second means for measuring the capacitance between said metal base and the electrical interconnects on said printed circuit board.

2. An apparatus according to claim 1 wherein said metal base is aluminum.

3. An apparatus according to claim 1 wherein said metal base is steel.

4. An apparatus according to claim 1 wherein said plastic film is polyethylene.

5. An apparatus according to claim 1 wherein said metal base has at least one aperture therein and said first means comprises a vacuum pump coupled to said metal base via said at least one aperture.

6. An apparatus according to claim 1 wherein said second means comprises:
    a capacitance meter having first and second terminals, said first terminal coupled to said metal base; and
    a probe coupled to said second terminal, said probe for puncturing said plastic film to make contact with said electrical interconnects.

7. An apparatus according to claim 6 further including means for recording measurements made by said capacitance meter.

8. A method for testing printed circuit boards having electrical interconnects thereon comprising:
    placing said printed circuit board on a metal base;
    covering said printed circuit board with a plastic film and coupling said plastic film to said metal base;
    creating a vacuum between said metal base and said plastic film whereby said printed circuit board is secured on said metal base by said plastic film;
    coupling one terminal of a capacitance meter to said metal base and a second terminal to a probe; and
    piercing said plastic film with said probe to make contact with said electrical interconnects.

9. A method according to claim 8 further including recording the measurements of said capacitance meter.

* * * * *